(12) United States Patent
Lee (10) Patent No.: US 7,358,557 B2
(45) Date of Patent: Apr. 15, 2008

(54) CAPACITOR FOR SEMICONDUCTOR DEVICE AND METHOD OF FORMING THE SAME

(75) Inventor: Yeong-Cheol Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/503,946

(22) Filed: Aug. 15, 2006

(65) Prior Publication Data

US 2006/0273369 A1 Dec. 7, 2006

Related U.S. Application Data

(62) Division of application No. 10/997,866, filed on Nov. 29, 2004, now Pat. No. 7,109,081.

(30) Foreign Application Priority Data

Nov. 29, 2003 (KR) .................. 10-2003-085919

(51) Int. Cl.
*H01L 27/108* (2006.01)
*H01L 29/76* (2006.01)

(52) U.S. Cl. ................. 257/309; 257/303; 257/306

(58) Field of Classification Search ............. 257/301, 257/303, 306–311, E21.012, E21.013; 438/243, 438/244, 253–256, 386, 387, 396–399, 665, 438/964
See application file for complete search history.

(56) References Cited

U.S. PATENT DOCUMENTS 5,256,587 A    10/1993    Jun et al.
5,274,258 A    12/1993    Ahn
5,316,982 A    5/1994    Taniguchi
5,719,419 A *    2/1998    Chao ..................... 257/309
5,807,782 A    9/1998    Koh et al.
5,866,454 A    2/1999    Chao
5,877,052 A    3/1999    Lin et al.
5,956,587 A    9/1999    Chen et al.
6,720,232 B1    4/2004    Tu et al.
2001/0004189 A1    6/2001    Seki

FOREIGN PATENT DOCUMENTS

| JP | 06-132493 | 5/1994 |
|---|---|---|
| JP | 8-255880 | 6/1996 |
| KR | 000045389 A | 7/2000 |
| KR | 010004189 A | 1/2001 |
| KR | 1020010061287 | 7/2001 |
| KR | 010073561 A | 8/2001 |
| KR | 010083402 A | 9/2001 |
| KR | 1020030075907 A | 9/2003 |

* cited by examiner

*Primary Examiner*—Hung Vu
(74) *Attorney, Agent, or Firm*—Volentine & Whitt, PLLC (57) ABSTRACT

A capacitor for a semiconductor device includes a lower electrode, a dielectric layer formed on a lower electrode, and an upper electrode formed on the dielectric layer. The lower electrode includes a first layer having a cylindrical shape and a mesh second layer formed on inner sidewalls and the bottom surface of the first layer. Beneficially, the first layer is connected to a conductive region of a semiconductor substrate by a contact plug. The lower electrode can be formed by injecting a catalyst into an opening in which the cylindrical first layer is to be formed before forming the cylindrical first layer.

7 Claims, 8 Drawing Sheets

CAPACITOR FOR SEMICONDUCTOR DEVICE AND METHOD OF FORMING THE SAME

CROSS REFERENCES TO RELATED APPLICATIONS

This is a divisional of U.S. patent application Ser. No. 10/997,866, filed 29 Nov. 2004 now U.S. Pat. No. 7,109,081, the contents which are incorporated herein by reference in their entirety, and also claims the priority benefit under 35 U.S.C. § 119 from Korean Patent Application 2003-85919, filed on 29 Nov. 2003, the contents of which are also incorporated herein by reference in their entirety.

BACKGROUND OF THE INVENTION

1. Field of the Invention

The present invention relates to a capacitor for a semiconductor device and a method of forming the same. More particularly, the present invention relates to an improved capacitor having a high capacitance and a method of forming the same.

2. Description of the Related Art

Recently, as information media such as computers have become widely used, the semiconductor industry has made great strides in the development of the information media products. Functionally, semiconductor devices with a large storage capacity are required to operate at a very high speed. Accordingly, semiconductor technology has improved the degree of integration, the reliability, and the response capability in order to increase the operating speed of semiconductor devices.

A dynamic random access memory (DRAM) has been the most widely used semiconductor memory device because of its ability to randomly read/write data, and its high storage capacity. In general, a DRAM device includes a memory cell region to store data as an electric charge, and a peripheral circuit region through which data is transferred as an electrical signal. The memory cell usually includes an access transistor and a storage capacitor.

The size of the capacitor has been reduced as the degree of integration of the memory devices has increased. Research has been widely conducted for a method of manufacturing a smaller, high-capacitance capacitor. In particular, a method of increasing the capacitance without increasing the capacitor's surface size has been studied in recent years.

The capacitance can be increased by: (1) increasing the surface area of the storage electrode, i.e., the lower electrode of the capacitor; (2) reducing the thickness of the dielectric layer; and/or (3) increasing the dielectric constant of the dielectric layer.

Conventionally, metal oxides such as $Ta_2O_5$, $TiO_2$, $Al_2O_3$, $Y_2O_3$, $ZrO2$, $HfO_2$, $BaTiO_3$ and $SrTiO_3$ have been used for the dielectric layer because of their high dielectric constants, as disclosed in U.S. Pat. No. 5,316,982, issued to Taniguchi et al. However, reducing the thickness of the dielectric layer has its own limits in view of the high degree of integration of the memory device. In addition, although various high dielectric constant materials, and various methods for manufacturing dielectric layers using the same, are widely known, it is difficult to adapt the dielectric materials in manufacturing the dielectric layer.

Accordingly, increasing the surface area of the storage electrode has been regarded as the most efficient method of improving the capacitance of a capacitor.

To increase the surface area of a storage electrode, the capacitor has developed from an initial plane structure to a stack structure or a trench structure, and from the stack structure to a cylindrical structure or a fin structure. For example, U.S. Pat. No. 5,656,536 discloses a conventional stacked structure capacitor having a crown shape; and U.S. Pat. No. 5,716,884 and U.S. Pat. No. 5,807,782 disclose other conventional stacked structure capacitors having a fin shape. U.S. Pat. No. 5,877,052 discloses a conventional method of increasing the capacitance by forming a hemispherical grain (HSG) layer on a storage electrode of a capacitor; and U.S. Pat. No. 5,956,587 discloses yet another conventional method of forming a HSG layer on a storage electrode having a cylindrical shape using above-mentioned methods.

However, the conventional methods of increasing the capacitance using the HSG layer has problems because a critical dimension (CD) between storage electrodes cannot be reduced to a desirable degree, and the HSG layer is often separated from the storage electrode to generate a process failure between two adjacent storage electrodes known as a "bridge". Accordingly, the conventional methods described above have many problems in forming capacitors with a design rule less than about 0.14 µm. Therefore, a cylindrical shaped capacitor with an increased height has been mainly used.

Example of a method of forming the cylindrical capacitor is generally disclosed in U.S. Pat. No. 6,657,377.

Figure 1A:
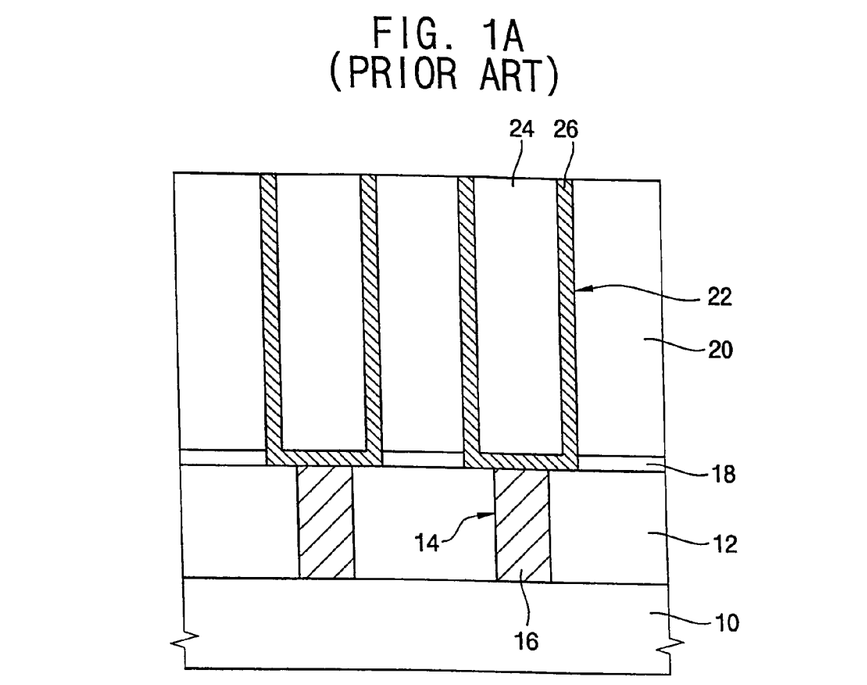
FIGS. 1A and 1B are cross sectional views illustrating a conventional method of forming a one-cylinder-stack (OCS) storage electrode structured capacitor.
Figure 1B:
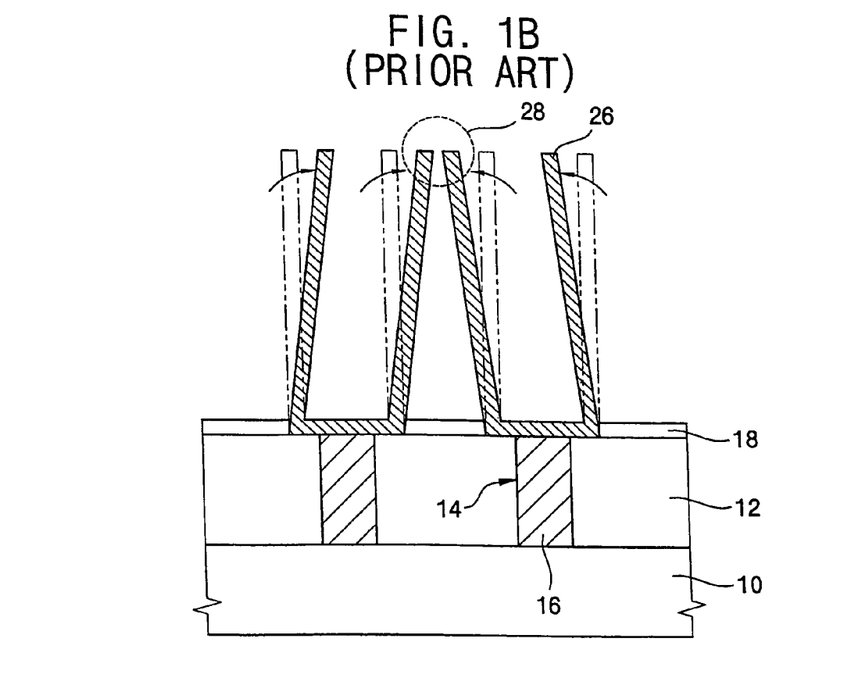

FIGS. 1A and 1B are cross sectional views illustrating a conventional method for forming a one-cylinder-stack (OCS) structured capacitor.

Referring to FIG. 1A, an insulating interlayer 12 is formed on a semiconductor substrate 10, and a contact hole 14 is formed by partially etching insulating interlayer 12, to expose a conductive region such as a source region (not shown) of semiconductor substrate 10. Then, a conductive material such as a doped polysilicon is filled into contact hole 14, to form a storage node contact plug 16.

An etching stop layer 18 of nitride, and a mold layer 20 of oxide are sequentially formed on insulating interlayer 12 and storage node contact plug 16. Subsequently, mold layer 20 and etching stop layer 18 are etched by an etching process, to form a storage node hole 22 to expose storage node contact plug 16.

A storage electrode layer 26 such as a polysilicon layer is formed on the bottom and sidewalls of storage node hole 22 and on the top surface of mold layer 20, and an oxide material is formed on storage electrode layer 26 to a sufficient thickness to fill storage node hole 22, thereby forming a sacrificial layer 24.

Sacrificial layer 24 and storage electrode layer 26 are removed to expose mold layer 20 by an etch back process or a chemical mechanical polishing (CMP) process, to form storage electrode 26 separated in accordance with each node of a memory device.

Referring to FIG. 1B, any residual of sacrificial layer 24 remaining in storage node hole 22 and mold layer 20 is removed by a wet etching process.

According to the conventional method described above, the height of the storage electrode is high to increase the capacitance, thus mold layer 20 is formed as thick as possible. In general, the thicker the mold layer 20, the greater the slope of storage node hole 22. Accordingly, the critical dimension (CD) around a bottom portion of storage node hole 22 is very small. A bottom portion of storage electrode 26, which is formed shallow and high, is narrow relative to a top portion of the storage electrode. Thermal stress generated in subsequent processes causes weak storage electrodes to break, thus creating bridge failures between two adjacent cells as depicted by reference numeral 28 in FIG. 1B. That is, a process failure is generated over two unit cells (2-bit failure).

In addition, the higher the storage electrode, the greater the step difference between a capacitor region and a non-capacitor region of a substrate, creating difficulties in the subsequent processes.

Korean Publication Patent No. 2003-75907 discloses forming at least one mold layer and at least one support having different etching rates, prior to performing an etching process to form a storage node hole. Therefore, the support prevents the storage electrode from breaking. However, this Patent has disadvantages in that additional processes are required to form the support such as a deposition process and an etching process. And also the processes to form the insulating interlayer disposed between the conductive structure and the storage electrode are very complicated.

SUMMARY OF THE INVENTION

Accordingly, it would be desirable to provide a capacitor for a semiconductor device capable of minimizing the step difference between conductive region and non-conductive region, and optimizing the surface area of the lower electrode.

According to an aspect of the present invention, a capacitor for a semiconductor device includes a semiconductor substrate, a lower electrode formed on the substrate, wherein the lower electrode comprises a first layer and a mesh second layer, a dielectric layer formed on the lower electrode; and an upper electrode formed on the dielectric layer.

According to another aspect of the present invention, a method of forming a capacitor for a semiconductor device includes forming a mold layer on a semiconductor substrate, forming a storage node hole to expose a conductive region of the semiconductor substrate by etching the mold layer, providing a catalyst into the storage node hole, forming a lower electrode having a first layer and a mesh second layer, and the first layer connected to the conductive region of the semiconductor substrate, forming a dielectric layer on the lower electrode, and forming an upper electrode on the dielectric layer.

Beneficially, a surface area of the lower electrode is sufficiently increased by the mesh second layer so that the capacitance of the capacitor is noticeably increased.

BRIEF DESCRIPTION OF THE DRAWINGS

The above and other aspects and advantages of the present invention will become readily apparent by reference to the following detailed description in view of the accompanying drawings, in which.

DESCRIPTION OF THE EMBODIMENTS

In the description to follow, it will be understood that when an element such as layer, region or substrate is referred to as being "on" or "onto" another element, the element is either directly on the other element, or intervening elements may also be present.

Figure 2:
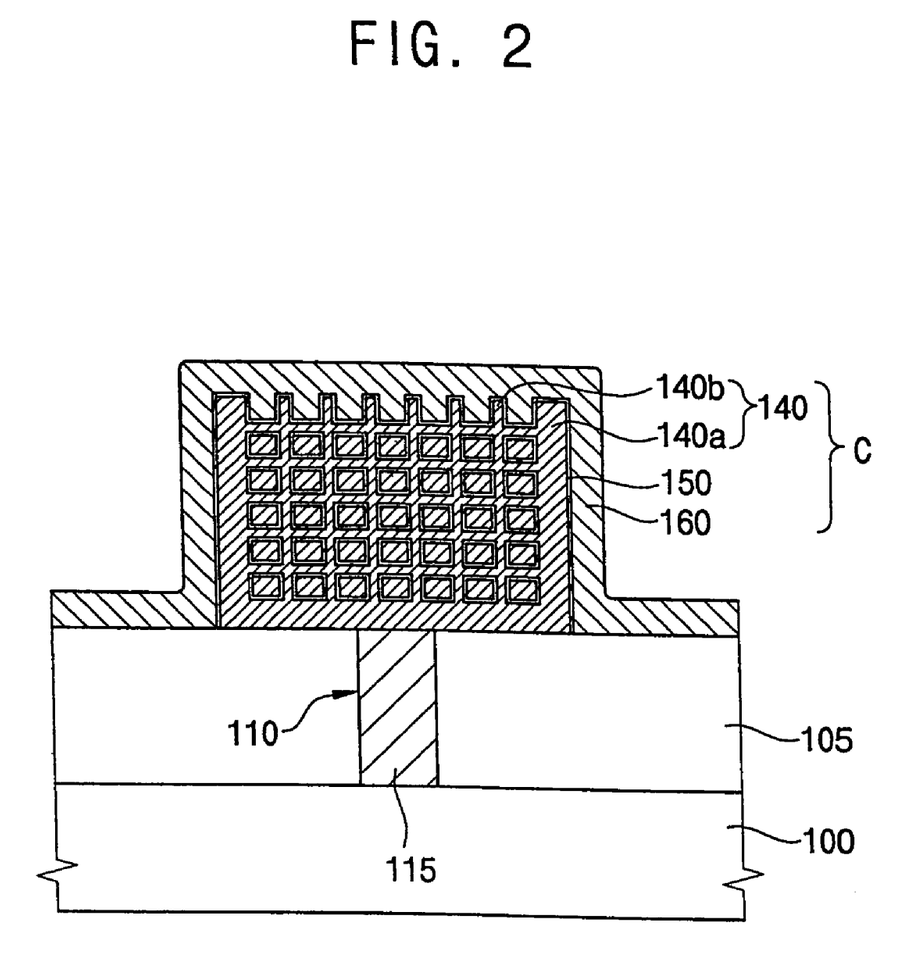
FIG. 2 is a cross sectional view illustrating a capacitor of a semiconductor device according to one or more aspects of the present invention.

FIG. 2 is a cross sectional view illustrating a capacitor of a semiconductor device.

Referring to FIG. 2, an insulating layer 105 having a contact hole 110 is formed on a semiconductor substrate 100. Contact hole 110 exposes a capacitor contact region such as a transistor source region, or a landing pad electrode (not shown) of substrate 100 which is electrically in contact with a source region. A contact plug 115 electrically in contact with the capacitor contact region is disposed in contact hole 110.

A lower electrode 140 of a capacitor C is disposed on insulating layer 105. Lower electrode 140 includes a cylindrically shaped first layer 140a electrically in contact with contact plug 115, and a second layer 140b in the form of a 3-dimensional mesh, disposed within cylindrical first layer 140a. Beneficially, the mesh second layer 140b comprises a plurality of strands extending perpendicularly from the interior surfaces of first layer 140a.

A dielectric layer 150 and an upper electrode 160 are sequentially disposed on lower electrode 140, thereby completing capacitor C.

FIGS. 3A to 3J are cross sectional views explaining a method of forming the capacitor shown in FIG. 2.

Figure 3A:
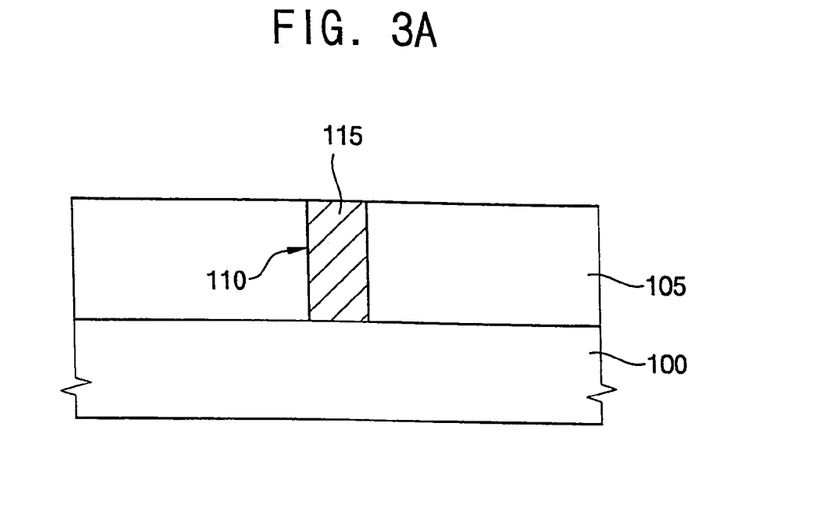
FIGS. 3A to 3J are cross sectional views explaining a method of forming the capacitor shown in FIG. 2.

FIG. 3A illustrates a step of forming contact plug 115 on semiconductor substrate 100.

Referring to FIG. 3A, a device isolation layer (not shown) is formed on semiconductor substrate 100 by a conventional device isolation process, thus defining an active region on substrate 100. Then, a device structure (not shown) having a capacitor contact region is formed on the active region. The device structure includes a transistor and a bit line, and the capacitor contact region includes a source region, or a landing pad region disposed on the source region.

An oxide material with a good planarization characteristic such as a boro-phospho silicate glass (BPSG), a spin on glass (SOG), or an undoped silicate glass (USG) is deposited on substrate 100 to form insulating layer 105. Insulating layer 105 is partially etched away by a photolithography process, thus contact hole 110 is formed to expose the capacitor contact region.

A conductive layer such as a doped polysilicon layer is formed on insulating layer 105 to a thickness sufficient to fill contact hole 110. Then, the conductive layer is removed by an etch-back process or a CMP process to expose a top surface of insulating layer 105. Accordingly, contact plug 115 formed in contact hole 110 is electrically contacted with the capacitor contact region.

Figure 3B:
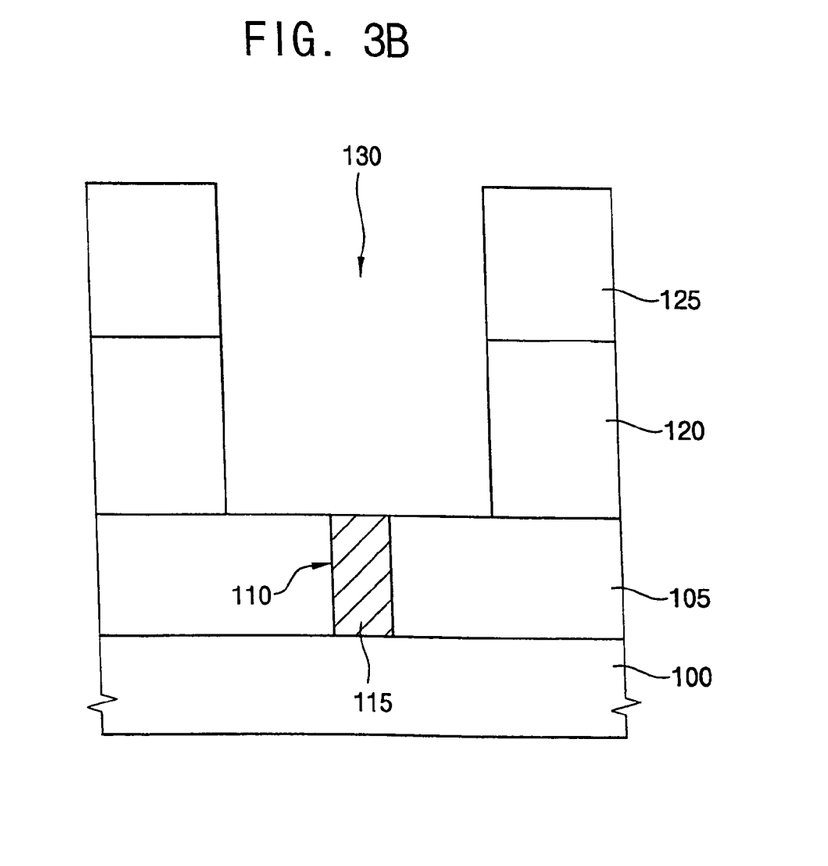

FIG. 3B illustrates a step of forming a storage node hole to expose contact plug 115.

Referring to FIG. 3B, an oxide such as a tetra ethyl ortho silicate (TEOS) is deposited on contact plug 115 and insulating layer 105 by, for example, a high-density plasma-chemical vapor deposition process, to form mold layer 120.

A photoresist film is formed on mold layer 120, and then the photoresist film is exposed and developed. Accordingly, photoresist pattern 125 is formed on mold layer 120.

Mold layer 120 is partially etched away using photoresist pattern 125 as an etching mask to form a storage node hole 130 near contact plug 115 and a portion of insulating layer 105 around contact plug 115.

Figure 3C:
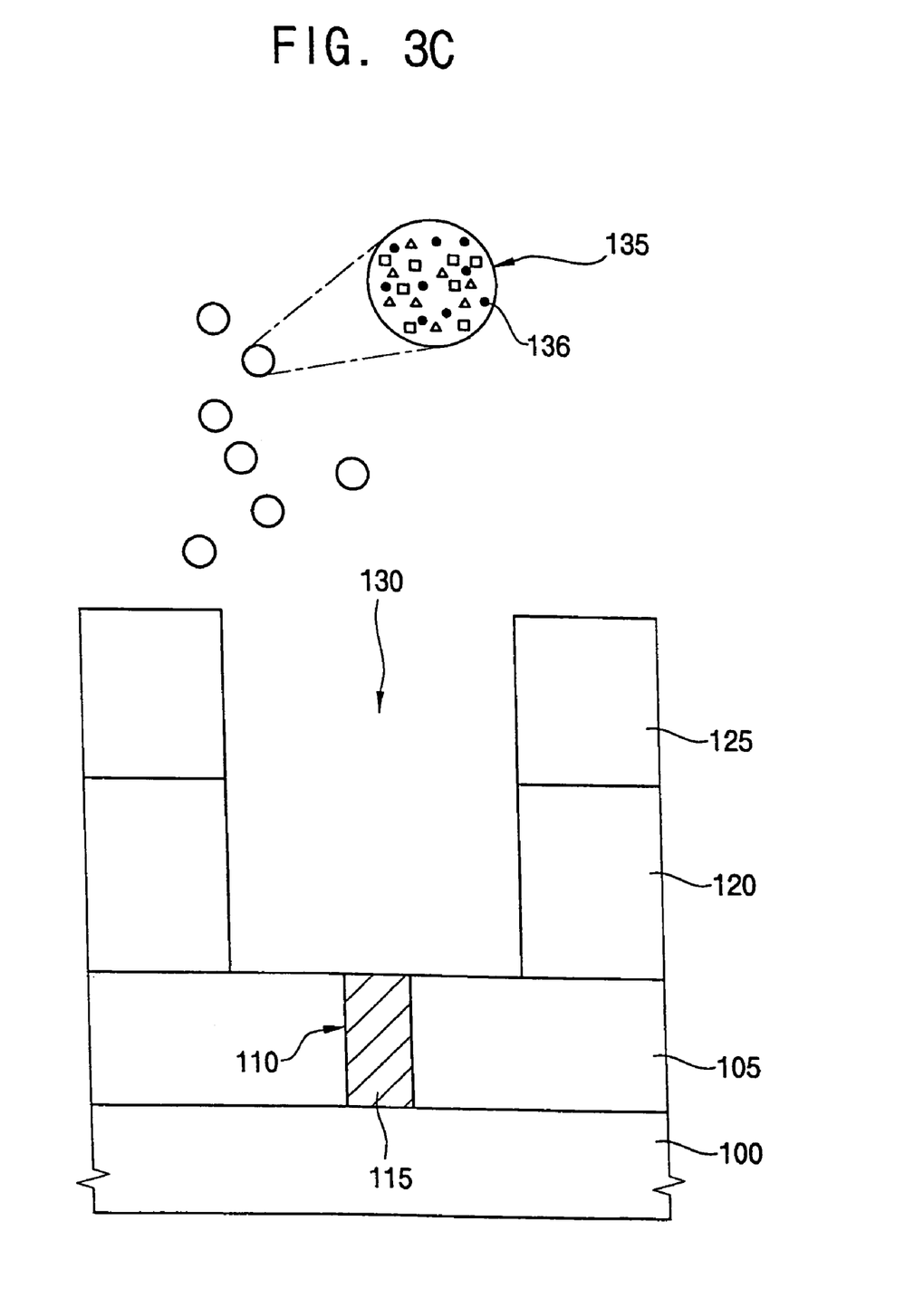
Figure 3D:
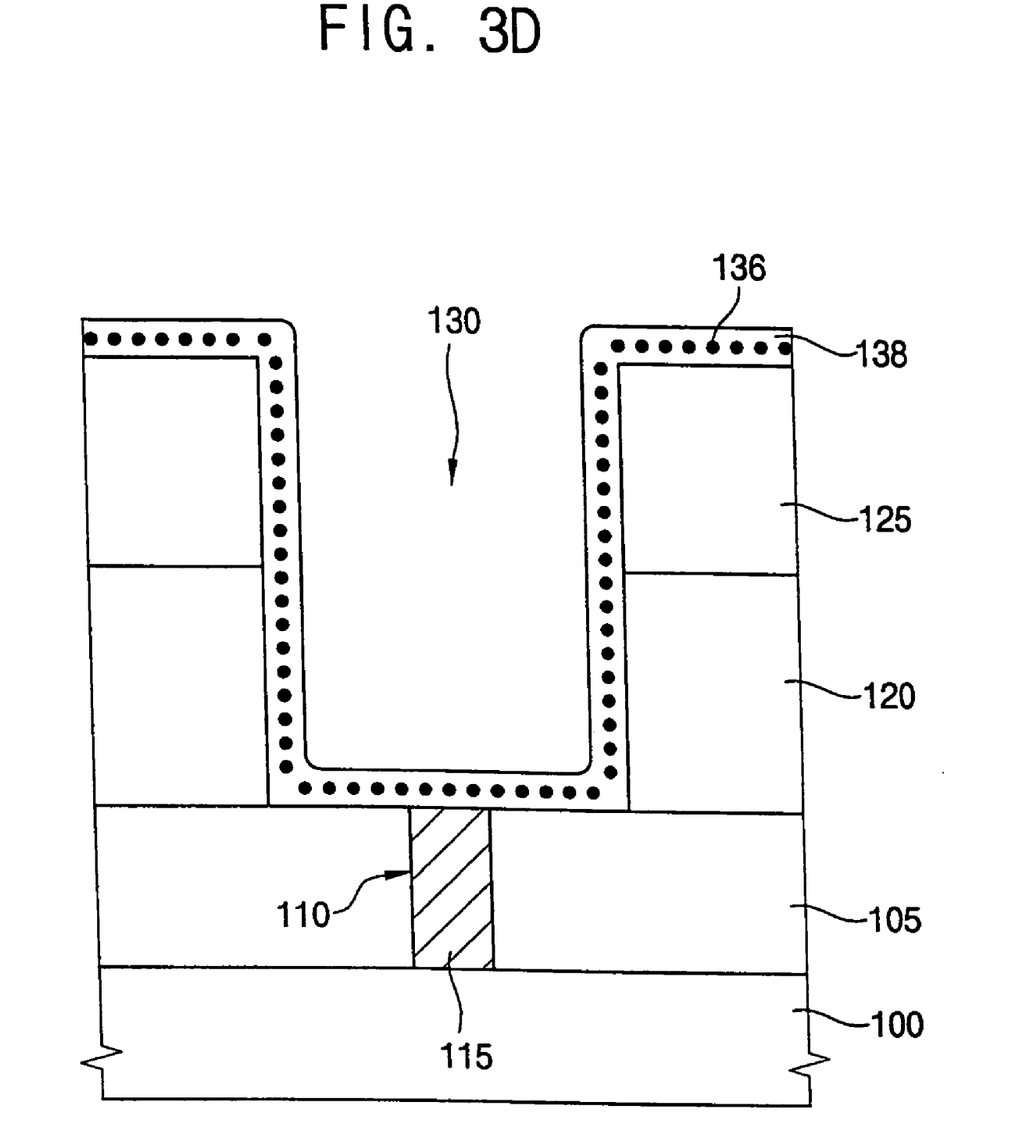
Figure 3E:
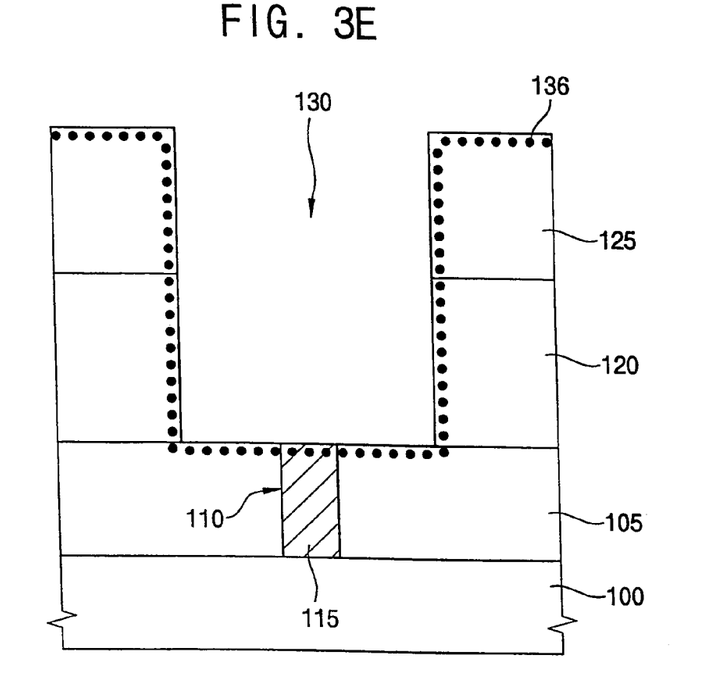

FIGS. 3C to 3E illustrate steps of providing a catalyst 136 onto a bottom and sidewalls of storage node hole 130.

A catalyst preferably includes a material to be ionized in mold layer 120 such as titanium (Ti), chromium (Cr), iron (Fe), manganese (Mn), or alkali earth metals. For example, the catalyst may be provided by a solution injection method using an electronegativity difference, a doping method using plasma energy, a diffusion injection method using thermal energy, or an ion injection method. As an exemplary embodiment, the catalyst is injected by the solution injection method using an electronegativity difference.

As shown in FIG. 3C, alkali earth metals are used as catalyst 136. An aqueous solution 135 of alkali earth metals (•) is supplied onto a surface of substrate 100. Aqueous solution 135 additionally contains negative ions ( ) such as OH ions and positive ions (Δ) such as H+ions.

Referring to FIG. 3D and FIG. 3E, a catalyst layer 138 is formed on the bottom and the sidewalls of storage node hole 130 and on the top surface of photoresist pattern 125. Water in catalyst layer 138 is removed using a spin dryer. As a result, catalyst 136 permeates through the bottom and the sidewalls of storage node hole 130 and on the top surface of photoresist pattern 125.

Figure 3F:
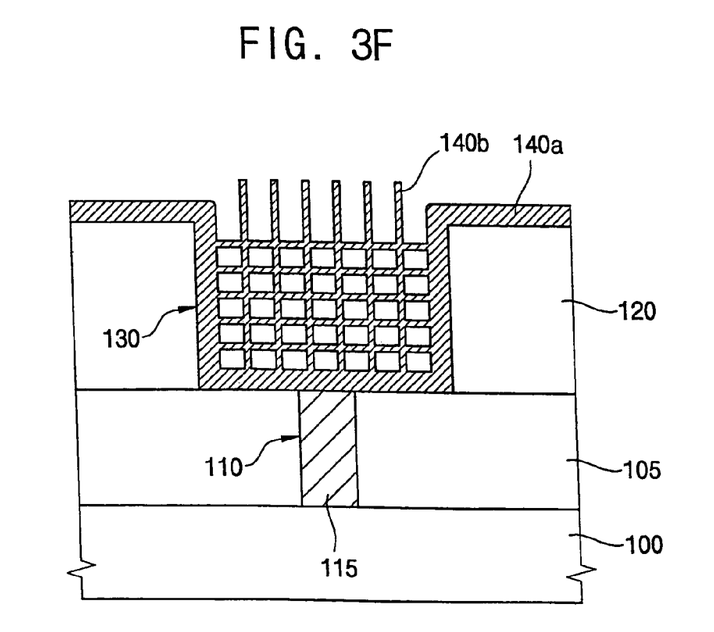

FIG. 3F illustrates a step of forming first and second layers 140a and 140b of lower electrode 140.

Referring to FIG. 3F, after the permeation of catalyst 136, photoresist pattern 125 is removed by ashing and stripping processes.

As an exemplary embodiment, first layer 140a of doped polysilicon layer is formed on the bottom and sidewalls of storage node hole 130 and on the top surface of mold layer 120. For example, an N-doped polysilicon material is deposited to a thickness of about 400 Å to 450 Å by a low-pressure chemical vapor deposition (LPCVD) process under a temperature of about 500° C. to 520° C., and a pressure of about 180Pa to 190Pa. Source gases for the LPCVD process such as a silane (SiH4) gas is provided at a flow rate of about 0.5 standard liter per minute (slm) and a phosphine (PH3) gas is provided at a flow rate of about 200 standard cubic centimeter per minute (sccm). While first layer 140a is formed, a 3-dimensional polysilicon mesh grows by the activation of catalyst 136 to form mesh second layer 140b. As an exemplary embodiment, mesh second layer 140b grows perpendicularly from surfaces of the first layer 140a.

The diameter of strands of the mesh second layer 140b is proportional to the deposition time of first layer 140a. Therefore, minimizing the first layer 104a deposition time will decrease the diameter of second layer 104b by several tens of Å, and maximize the surface area of lower electrode 140. In addition, if the diameter of second layer 140b increases, the second layer 140b warps due to an increase in the inner stress. Minimizing the deposition time of first layer 140a ensures that second layer 140b grows in a relatively straight line, thereby second layer 140b grows perpendicularly from the first layer 140a.

Figure 3G:
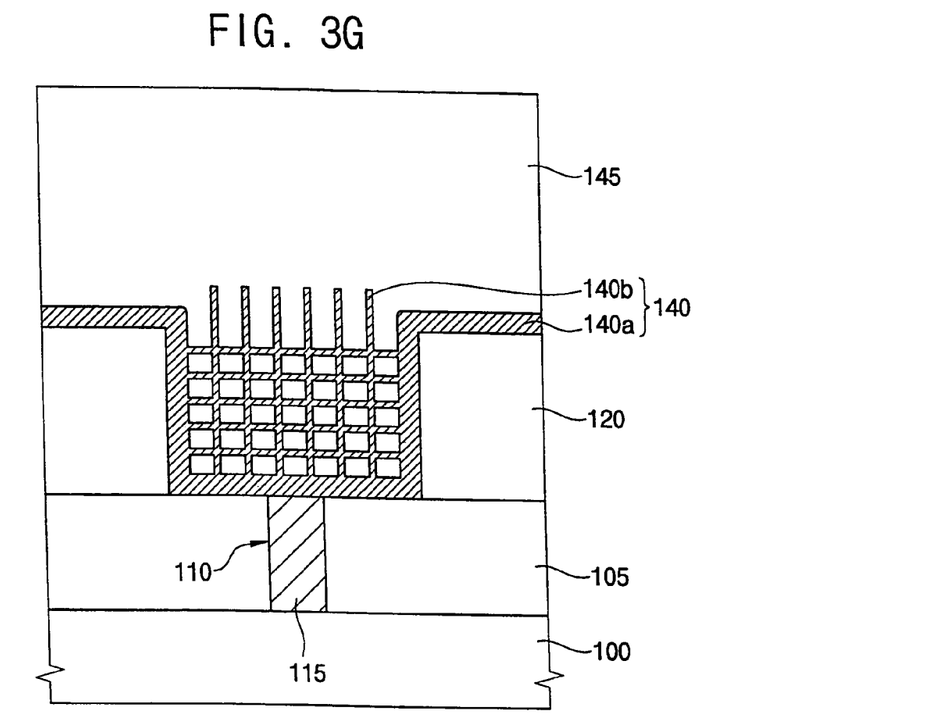

FIG. 3G illustrates a step of forming a sacrificial layer 145 on lower electrode 140.

Referring to FIG. 3G, an oxide material such as SOF or USG is deposited on first and second layers 140a and 140b to a thickness sufficient to fill storage node hole 130 and form sacrificial layer 145.

Figure 3H:
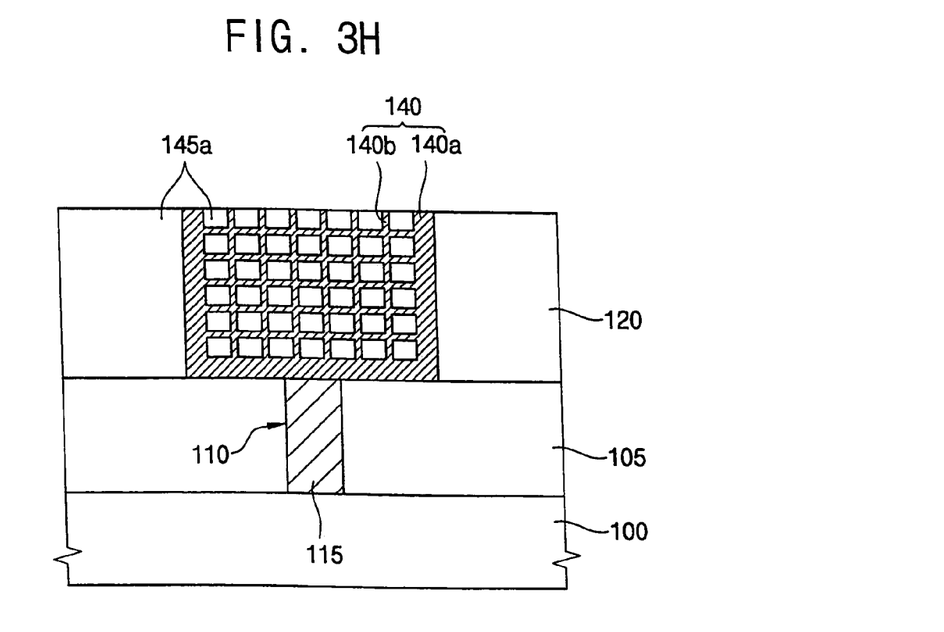

FIG. 3H illustrates a step of forming lower electrode 140.

Referring to FIG. 3H, first layer 140a is removed by an etch-back or a CMP process until the top surface of mold layer 120 is exposed.

Although FIGS. 3C-3F show an embodiment where the photoresist pattern 125 is removed after the injection of catalyst 136 and after second layer 140b is grown, alternatively catalyst 136 may be injected to the bottom and sidewalls of storage node hole 130 after removing photoresist pattern 125. For example, after photoresist pattern 125 is completely removed, a catalyst is injected on the top surface of mold layer 120, the bottom and sidewalls of storage node hole 130. Therefore, second layer 140b also grows on first layer 140a disposed on the top surface of mold layer 120. As a result, when first layer 140a is removed from layer 120 by an etch-back process or a CMP process, an additional step and time are saved.

Figure 3I:
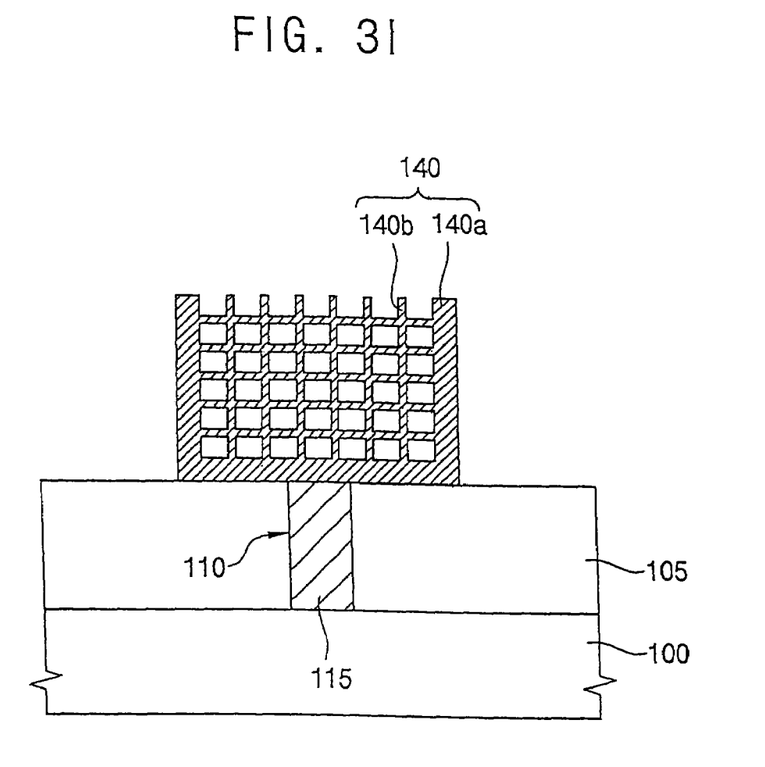
Figure 3J:
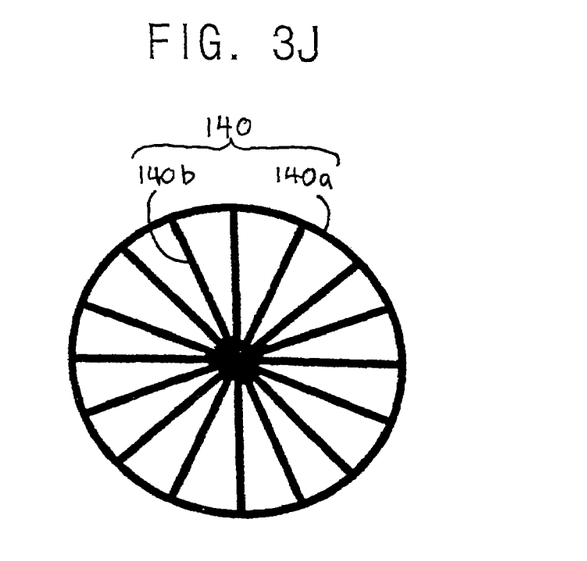

FIG. 3I illustrates a step of completing lower electrode 140 of capacitor C, and FIG. 3J is a plan view illustrating lower electrode 140 of capacitor C.

Referring to FIGS. 3I and 3J, sacrificial layer 145 and mold layer 120 are completely removed by a wet etching process, thus completing the formation of lower electrode 140 of capacitor C. As an exemplary embodiment, a limulus amebocyte lysate (LAL) solution is used as an etching solution in the wet etching step. The LAL solution is a mixture of ammonium fluoride, hydrofluoric acid, and deionized water.

As shown in FIG. 3J, mesh second layer 140b is disposed inside cylindrical first layer 140a, having first members extending perpendicularly (upward) from the bottom of first layer 140a, and then having second members extending perpendicularly in both directions from the first members across the interior cross-section of the cylindrical first layer 140a.

Again referring back to FIG. 2, dielectric layer 150 having a high dielectric constant such as an oxide/nitride/oxide layer (ONO layer) is formed on lower electrode 140. Subsequently, an upper electrode 160, such as a doped polysilicon layer, is formed on dielectric layer 150 to complete the capacitor having an increased surface area.

Since the 3-dimensional mesh structure substantially increases the surface area of the lower electrode, the height of the capacitor can be reduced for the same capacitance compared to a similar capacitor structure without the mesh. Accordingly, the step difference between the capacitor region and the non-capacitor region of the substrate is minimized. Furthermore, a single mold layer is formed to pattern the lower electrode, thus simplifying the process of forming the capacitor and improve process efficiency.

Although the exemplary embodiments of the present invention have been described, it is understood that the present invention should not be limited to these exemplary embodiments but various changes and modifications can be made by one skilled in the art within the scope of the present invention as hereinafter claimed.

What is claimed is:

1. A capacitor for a semiconductor device, comprising:
a lower electrode formed on a semiconductor substrate, wherein the lower electrode comprises a first layer having a cylindrical shape and a mesh second layer formed to extend across an interior of the first layer;
a dielectric layer formed on the lower electrode; and
an upper electrode formed on the dielectric layer.

2. The capacitor of claim 1, wherein the mesh second layer comprises a plurality of strands extending perpendicularly from interior surfaces of the first layer.

3. The capacitor of claim 1, further comprising an insulating layer disposed between the semiconductor substrate and the lower electrode and having a contact hole for exposing a conductive region of the semiconductor substrate, and a contact plug disposed in the contact hole, wherein the first layer is disposed on the insulating layer and is in contact with the contact plug.

4. The capacitor of claim 1, wherein an upper portion of the lower electrode has a concave and convex structure.

5. The capacitor of claim 1, wherein the lower electrode is formed using a catalyst including a material to be ionized.

6. The capacitor of claim 5, wherein the material to be ionized comprises one selected from the group consisting of titanium (Ti), chromium (Cr), iron (Fe), manganese (Mn), and alkali earth metals.

7. The capacitor of claim 5, wherein the catalyst further includes negative ions and positive ions.

* * * * *